United States Patent
Shum et al.

(10) Patent No.: US 6,628,544 B2
(45) Date of Patent: Sep. 30, 2003

(54) FLASH MEMORY CELL AND METHOD TO ACHIEVE MULTIPLE BITS PER CELL

(75) Inventors: Danny Shum, Poughkeepsie, NY (US); Georg Tempel, Sterrebeek (BE); Christoph Ludwig, Langebrueck (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/057,039

(22) Filed: Jan. 25, 2002

(65) Prior Publication Data

US 2003/0142541 A1 Jul. 31, 2003

Related U.S. Application Data

(63) Continuation of application No. 09/772,220, filed on Jan. 29, 2001, and a continuation of application No. 09/410,119, filed on Sep. 30, 1999, now Pat. No. 6,307,781.

(51) Int. Cl.[7] .............................................. G11C 16/04
(52) U.S. Cl. .......................... 365/185.03; 365/185.28; 365/185.26
(58) Field of Search ....................... 365/185.03, 185.01, 365/185.1, 185.14, 185.26, 185.28, 185.33, 185.27

(56) References Cited

U.S. PATENT DOCUMENTS

| | | | |
|---|---|---|---|
| 5,225,362 A | 7/1993 | Bergemont | 437/43 |
| 5,422,845 A | 6/1995 | Ong | |
| 5,487,033 A * | 1/1996 | Keeney et al. | 365/185.19 |
| 5,515,317 A | 5/1996 | Wells et al. | 395/427 |
| 5,553,020 A | 9/1996 | Keeney et al. | 365/185.19 |
| 5,689,459 A | 11/1997 | Chang et al. | 365/185.28 |
| 5,751,631 A | 5/1998 | Liu et al. | 365/185.01 |
| 5,764,571 A | 6/1998 | Banks | |
| 5,814,854 A | 9/1998 | Liu et al. | 257/315 |
| 5,867,425 A | 2/1999 | Wong | 365/185.08 |
| 5,872,732 A * | 2/1999 | Wong | 365/185.18 |
| 5,896,315 A | 4/1999 | Wong | 365/185.01 |
| 5,926,418 A | 7/1999 | Wong | 365/185.28 |
| 5,940,325 A | 8/1999 | Chang et al. | 365/185.28 |
| 5,998,826 A | 12/1999 | Hung et al. | 257/315 |
| 6,026,017 A | 2/2000 | Wong et al. | 365/185.05 |
| 6,027,974 A | 2/2000 | Liu et al. | 438/258 |
| 6,088,263 A | 7/2000 | Liu et al. | 365/185.05 |
| 6,091,101 A | 7/2000 | Wang | |
| 6,091,634 A | 7/2000 | Wong | 365/185.14 |
| 6,091,636 A | 7/2000 | Liu et al. | 365/185.19 |
| 6,127,225 A | 10/2000 | Liu et al. | 438/258 |
| 6,133,604 A * | 10/2000 | Chi | 257/315 |
| 6,159,800 A * | 12/2000 | Liu et al. | 365/185.08 |
| 6,207,507 B1 | 3/2001 | Wang | |

* cited by examiner

Primary Examiner—Thong Le
(74) Attorney, Agent, or Firm—Thomas R. FitzGerald, Esq.

(57) ABSTRACT

A method of flash memory cell programming is provided which uses a uniform electric potential across tunnel oxide. The tight Vt distribution and very stable Vt shift over program/erase cycling allows for a multi-level cell capable of having more than 2 bits per cell.

12 Claims, 4 Drawing Sheets

FLASH MEMORY CELL AND METHOD TO ACHIEVE MULTIPLE BITS PER CELL

This application claims the benefit of U.S. Ser. No. 60/179,234 filed, Jan. 31, 2000; and is a continuation of U.S. Ser. No. 09/772,220 filed Jan. 29, 2001, and a continuation of U.S. Ser. No. 09/410,119 filed Sep. 30, 1999 (now issued U.S. Pat. No. 6/307,781; Issued: Oct. 23, 2001).

BACKGROUND OF THE INVENTION

Density is a major consideration in fabrication of semiconductor memories. The cost of manufacture of a memory device is directly related to the amount of semiconductor real estate used in storing a bit of information on a semiconductor chip. Costs can be reduced by scaling feature size to place more transistors on a single substrate and thereby achieve high density. Another cost-saving technique that stores more data in a given device is Multi-Level Cell (MLC) technology. It further increases cell density by increasing the number of possible states associated with a memory cell. MLC technology allows a memory cell to store information corresponding to more than one bit. Consequently, four logical states from a selection of $2^N$ states (N=2) can be stored in each cell. Each state corresponds to a two-bit data pattern 00, 01, 10 or 11. Eight logical states from a selection of $2^N$ states (N=3) can be stored in each cell. Each state corresponds to a three-bit data pattern 000, 001, 010, 100, 011, 101, 110, or 111, and so on.

U.S. Pat. No. 5,553,020, entitled "Structure and Method for Low Current Programming of Flash EEPROMS," by Stephen N. Keeney and Gregory E. Atwood, and U.S. Pat. No. 5,515,317, entitled "Addressing Modes for a Dynamic Single Bit Per Cell to Multiple Bit Per Cell Memory," by Steven E. Wells and Kurt B. Robinson are hereby incorporated by reference. Those patents indicate how EEPROM memories can be adapted to store multiple bits per cell. The Kenney et al. patent reports that its technique can place 64 ($2^6$) different levels of voltage on the memory cells. However, one drawback of such devices is their continued reliance upon hot electron injection to program the cells. Such programming techniques have a narrow threshold distribution but they require high programming currents that make them unsuitable for portable equipment.

Conventional flash memories can be programmed by using hot electron injection or Fowler-Norheim (FN) tunneling and all are erased by FN tunneling. Hot electron injection is the conventional method of programming and Fowler-Norheim tunneling is the conventional method of erasure. Hot electron injection relies upon creating an avalanche of electrons beneath the floating gate. During programming, the control gate is biased to a high voltage to turn on the channel by creating an inversion layer beneath the gate. The source and substrate are held at ground. Next, the drain is biased to near Zener diode (pn junction) breakdown (about 0.5 volts below junction breakdown) to pinch off the channel. Electrons become "hot" (energetic) and accelerate toward the drain. Programming occur when the voltage on the floating gate Vfg exceeds 3.2V (Si/SiO2 energy barrier). Electrons are injected at the pinch-off region toward the floating gate by momentum transfer. In a typical hot electron programming operation the control gate is biased of about +12 volts and the drain is biased to about 6.5 volts.

Flash memory cells have enjoyed recent commercial success due to their relatively low cost, the ease in erasing information stored in a flash memory array and their applications to bank check cards, credit cards, and the like. A flash memory cell, which is recognized by the semiconductor industry as a standard, has not yet emerged. Existing flash memories embody different architectures. The programming, reading and erasing of cells can be generally described under one of the following architectures-NOR, AND, or NAND. Further, the programming mechanism of the flash memory cell typically involves Fowler-Nordheim tunneling through an energy barrier between the floating gate overlap and the drain/source region or electron injection over an energy barrier.

Hot electron injection is faster than Fowler-Norheim tunneling. However, hot electron injection also requires program currents higher than currents required for Fowler-Norheim programming. The additional current required for hot electron injection is a disadvantage for battery-operated systems because frequent programming rapidly depletes the energy stored the battery and requires a complex charge pump design to supply enough current during programming for portable system. This is especially critical for very small supplies, such as the batteries included in smart cards.

Flash memory arrays that operate with FN tunneling for erase mechanisms can involve floating gate-to-channel, floating gate-to-drain or floating gate-to-source as the charge clearing path from the floating gate. The floating gate to drain or source path is deleterious to erase operations and destroys the tunnel oxide area located between the floating gate overlap and the drain/source region. This is known as edge effect programming and it leads to a wide threshold voltage (Vt) distribution in large memory array, which is useless for MLC applications. Edge effect may damage or destroy the tunnel oxide through the programming mechanisms (e.g., programming a logic one or logic zero on the floating gate). These programming mechanisms can include charge carrier paths between the floating gate and drain or alternatively between the floating gate and source.

However, conventional cells do not include a programming operation involving a Fowler-Nordheim tunneling path between the channel and floating gate. Such an operation would be desirable because it could limit tunnel oxide damage or degradation because the electric field is distributed across the entire tunnel oxide region. This lessens the possibility of damage because the electric field in not concentrated at the edge but is distributed over the channel. This field re-distribution effect results in a narrow threshold voltage (Vt) distribution due to elimination of edge effect programming. Until now, a flash memory cell for NOR-type random access architectures, which allows uniform channel programming, has not existed. It would meet an unfilled need in the art to provide a NOR-type architecture with Fowler-Norheim tunneling for programming and erasing.

SUMMARY

The invention provides a programmable cell with triple well structure and a method of programming a flash memory array. In each cell there is a floating gate transistor. The triple well structure includes a substrate (third well) that has first and second wells. The first well is contained in the second well and the second well is of opposite polarity compared to the substrate and the first well. The first well comprises source and drain regions with a channel disposed between them. A floating gate insulating layer covers the channel and a floating gate electrode is on the floating gate insulator. An inter-gate insulator covers the floating gate electrode and is covered by a control gate electrode. A suitable voltage supply reverse biases the first well with respect to the second well. A uniform potential is applied to the channel via a programming voltage applied to the control gate electrode. The potential of the source region floats. The control gate voltage is adjusted to an intensity that is substantially uniform across the surface of the channel. As the voltage is increased, electrical charges tunnel through the floating gate oxide and are stored in the floating gate. Erasing is accomplished by reversing the process.

The structure and method may be practiced with either a one-transistor or a two-transistor cell and are compatible with P-MOS and N-MOS processes. The cells can be configured into NOR-type architectures. For a typical N-MOS floating gate transistor, the first p-type well is held at about −3 volts, the control gate is raised to about 12 to 13 volts and the source is allowed to float. For a P-MOS device, the first n-type well is held at about +3 volts and the control gate is lowered to about −12 to −13 volts and the source is allowed to float. The invention is capable of storing multiple different levels of charge in the floating gate.

BRIEF DESCRIPTION OF THE DRAWINGS

Like reference numerals in different figures refer to corresponding like elements.

DETAILED DESCRIPTION OF THE INVENTION

Figure 1:
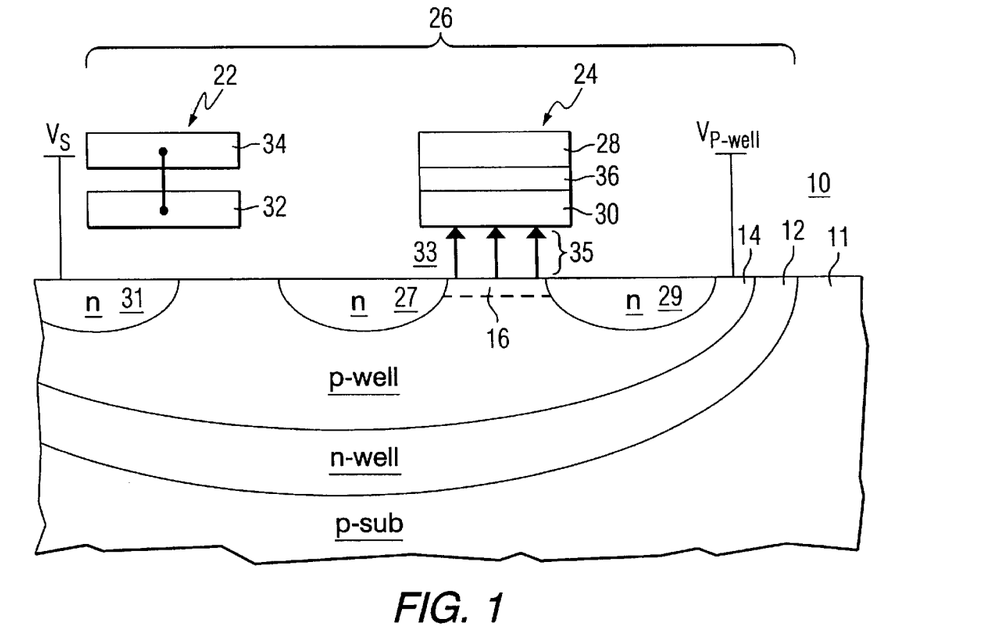
FIG. 1 is a partial cross-sectional view of a two-transistor flash memory cell according to the invention.

FIG. 1 illustrates a partial schematic/partial cross-sectional view of a two-transistor flash memory cell 26 according to the invention. The cell 26 may be constructed according to conventional and other known fabrication methods combining triple well formation with double polysilicon technology. The triple-well cell 26 comprises a first well region 14 (labeled here as p-well), a second well region 12 (labeled here as n-well) and a third well or substrate region 11 (labeled here as p-sub). Cell 26 includes a select transistor 22 and a floating gate transistor 24. The conductivity type of the transistors (e.g., n-type or p-type) will change according to the type of field-effect transistor being fabricated for the cell. The foregoing conductivity types correspond to n-channel devices. Opposite conductivity types to those named would be used with p-channel devices. Drain region 29 and source region 27 serve as the drain and source regions respectively for the floating gate transistor 24. In contrast to hot injection devices, the drains and sources of the invention may be symmetrical in doping.

Figure 2:
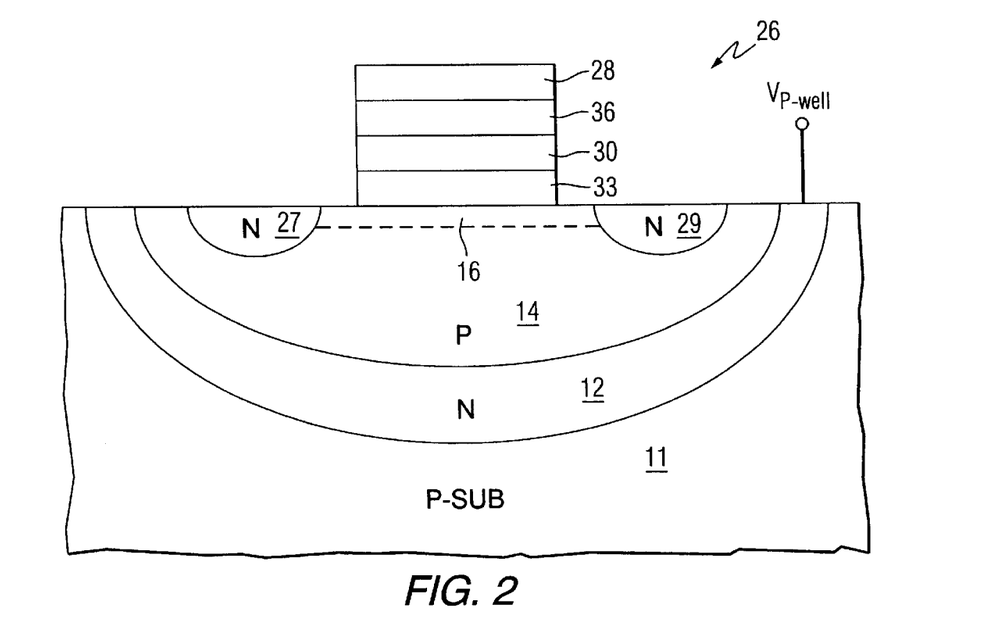
FIG. 2 is a partial cross-sectional view of a one-transistor flash memory cell according to the invention.

The floating gate transistor 24 includes a floating gate insulator 33 formed on the substrate 11. The insulator 33 is typically silicon dioxide, oxynitride, or silicon nitride. It is approximately 100 Å thick, but may be of any suitable thickness for tunneling operations. A floating gate electrode 30 is formed on the insulator 33. The electrode 30 is highly conductive and may be formed from heavily doped polysilicon or metal. An inter-gate insulator 36 covers the floating gate electrode 30 and is covered with a control gate electrode 28. The control gate electrode 28 may also be formed from heavily doped polysilicon or metal. Select transistor 22 connects the floating gate transistor 24 to the rest of the memory array in a manner well known in the art. The control and floating gates 32, 34 of the select transistor 22 are shorted or otherwise connected together. N-type source diffusion 31 provides access to the source 27 of floating gate transistor via select transistor 22. Channel 16 lies beneath the floating gate 30 and between the source 27 and drain 29. In FIG. 2 there is shown a partial schematic of a one-transistor (1T) cell. Identical reference numbers in FIGS. 1 and 2 correspond to like elements.

Programming

The mechanism of uniform channel programming biases the gate voltage $V_G$ positive so that the channel 16 is on. A typical gate bias of +12 volts creates an inversion layer that connects the source to the drain. See FIG. 1 for the 2T cell and FIG. 2 for the 1T cell. The voltage ($V_D$) on the drain 29 is toggled low (typically −3V) and is applied to the drain end 29 of the channel. The p-well is also biased to the same $V_D$ (−3V) to prevent the source/drain junction from forward biasing due to −3V (NMOS construction). Since the channel 16 is on, the drain voltage is passed to the floating source and the entire channel is at a common voltage of, for example, about −3 volts. In 2T case, the select transistor 40 are held at a low level, typically −3 volts. Thus, the select transistor 40 is electrically off due to the well bias. This caused the source of the floating gate transistor 24 to float, and the device behaves like a 1T case. As such, the voltage over the channel is the gate voltage (+12 volts) less the drain/source voltage (−3 volts) for a voltage difference of about 15 volts. That is enough voltage for electrons 35 to tunnel under the floating gate insulator 33. PMOS devices are programmed in a similar way, with a corresponding reversal in the polarities of the applied voltages. In a PMOS device the gate is biased negative and the drain has a small positive voltage. The voltage difference across the channel is again about 15 volts. That voltage difference is sufficient to generate tunnel holes through the gate oxide interface. The holes are stored in the floating gate.

Figure 3:
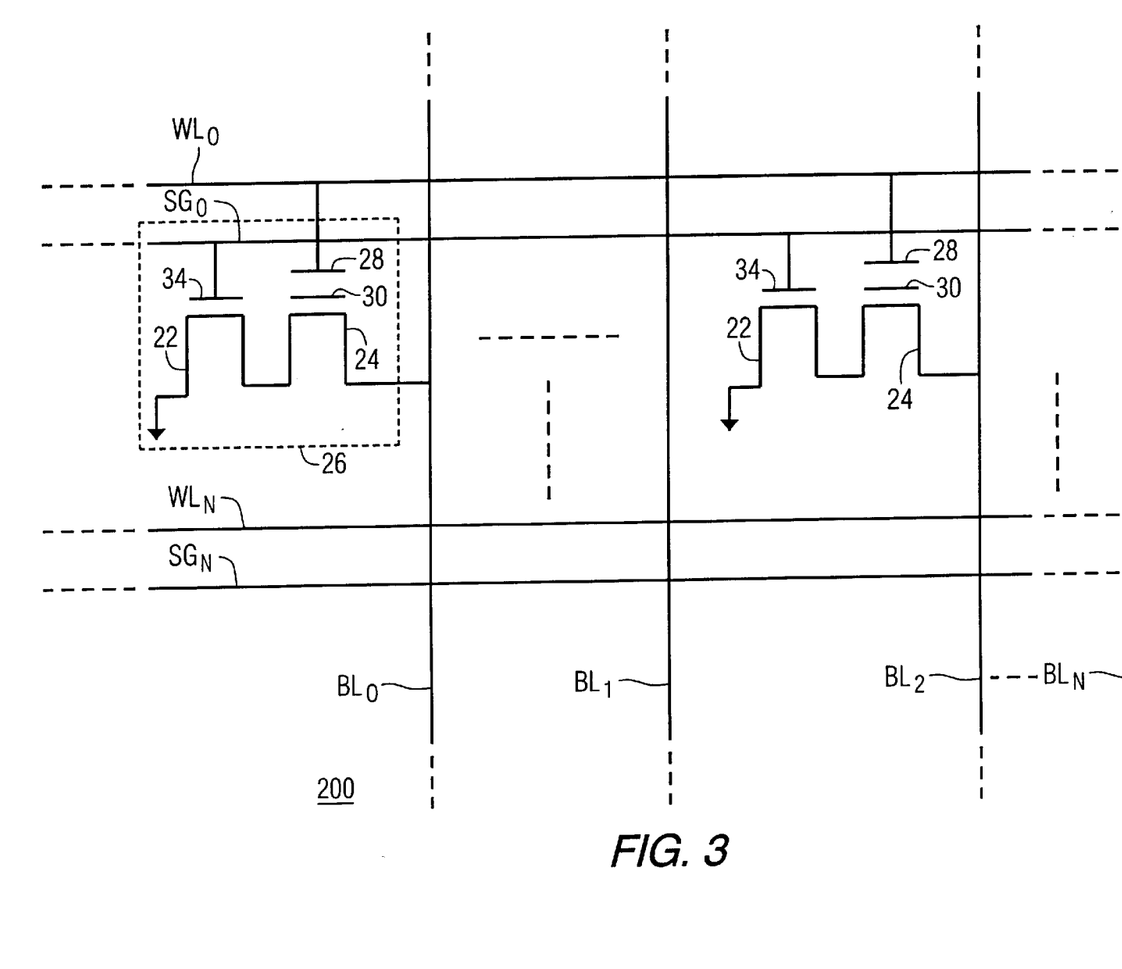
FIG. 3 is a partial schematic of a two-transistor flash memory cell array according to the invention.
Figure 4:
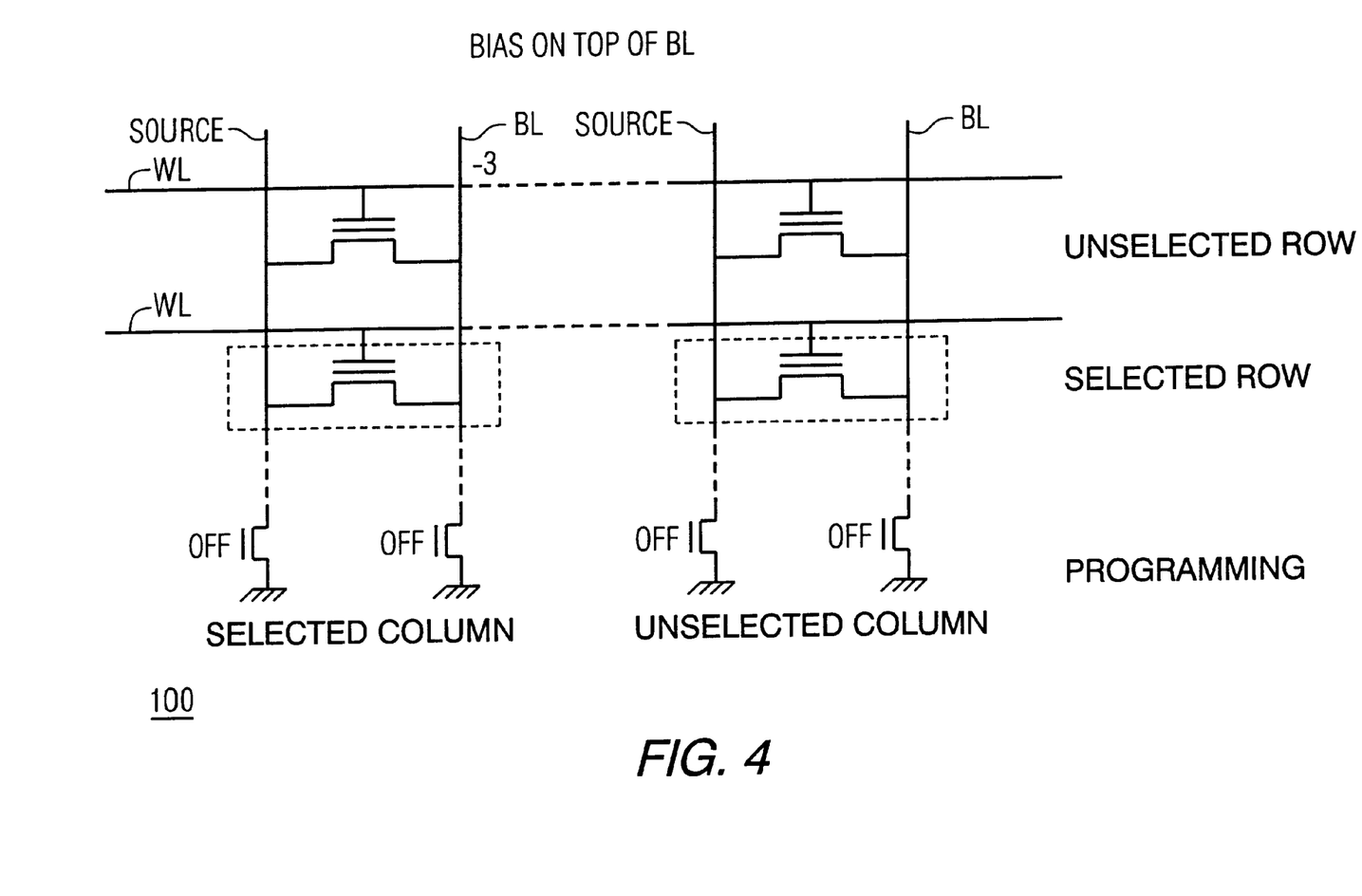
FIG. 4 is a partial schematic of a one-transistor flash memory cell array according to the invention.

FIGS. 3 and 4 show, respectively, partial schematics of a two-transistor and a one-transistor cell arrays, 200, 100. The array 200 includes the 2T cell 26 in each cell. The drains of each floating gate transistor 24 in a column are connected together by a common bit line such as BL0, BL1, . . . BLn. The control gates 28 of each floating gate transistor 24 in each row are connected together by a common word line. The array 200 has word lines WL0, WL1 . . . WLn. The control gates of each select transistor 22 in each row are connected together by a common select line SG0, SG1 . . . SGn. The select lines are operable to carry voltages capable of turning select transistor 22 on or off, thus selecting a cell. To program a cell 26, the associated bit line (BL) is toggled low (typically −3 volts) while the associated word line (WL) is toggled strongly high, about +12 volts. The p-well is also biased to the same BL voltage (−3V) to prevent the source/drain junction from forward biasing due to −3V (NMOS construction). An appropriate voltage on the bit line and the word line of a cell selects the cell. The select line is held low to turn off the select transistors in a given row and thereby isolate the selected cell from the rest of the array 200. In the 2T case, the select transistor gate is held at a low level, typically −3 volts.

Unselected cells sharing the same word line as the selected cell could be subject to a phenomenon known as gate disturb, where the unselected cell could be unintentionally programmed. However, by applying a full voltage swing of opposite polarity between the selected bit line and unselected bit line, a disturb event is less likely to occur. A typical strong high voltage for the selected word line for device 26 is around 12 to 13 volts. The control gate of the floating gate transistor 24 is pulsed to set the threshold of the transistor 24 at one of a number of different logical states. The control gates of the unselected select transistors 22 are held at a low level, typically −3 volts. The bit lines of unselected columns remain at a high level, e.g., around 3 to 4 volts. Thus the gate disturb on the unselected cells sharing the same word lines reduce to a net gate voltage of ~9V (12/13V−3/4V) over the channel. That voltage is near to the minimum voltage needed for tunneling, greatly reduce any gate disturb. The word lines of unselected rows are grounded or slightly negative. The bias of the p-well region 14 is held at a low voltage (e.g. −3 volts) while the source voltage in the 1T cell or the voltage $V_S$ for the 2T cell is left floating. Unselected cells which are associated with the bit line of a selected cell, such as BL0 are subject to a phenomenon known as drain disturb wherein one of these unselected cells may be unintentionally programmed. To prevent such an error, the unselected wordline is bias to zero or −3V. Since a strong program voltage (i.e. 12 volts) generally required for programming device 40, this high program voltage makes occurrence of drain disturb less likely.

In connection with programming, a depletion mode transistor is turned off (programmed off or made to store a logic low level voltage) by carriers that (with reference to FIG. 1) tunnel in the direction of arrows 35 through a Fowler-Nordheim mechanism to floating gate 24. For device 24, the carriers are electrons. Note that tunneling through gate oxide 33 occurs from the channel region to the floating gate 30, rather than from a drain or source region to the floating gate. This particular tunnel mechanism helps prevent the destruction of the tunnel oxide as discussed in the foregoing section concerning prior art devices. The negative voltage (−3 volts) on the p-well 14 provides that well with a large supply of minority charge carriers (electrons). When a positive voltage is applied to the control gate electrode 28, the minority charge carriers in the p-well 14 are attracted toward the floating gate 30 that lies over the channel 16. As the voltage on the control electrode 28 increases, the electrons in the channel 16 tunnel through the oxide 33 and are captured by the floating gate 24. The foregoing voltage characterizations apply to n-channel transistors. Opposite voltage levels (e.g. low instead of high, etc.) apply to p-channel transistors.

The 1T cell in array 100 is programmed in a similar manner. The sources of the transistors 24 in a given column are connected to a common source line SL0, SL1 . . . SLn which are connected together by a common SG line. The word line and the bit line determine the cell selected for programming. SG is biased to the same well potential to trigger an off state in order to isolate the local source line from other source lines, and to allow the source to float.

Erasing

With reference to the 1T array 100, one may erase the entire array or block erase one row at a time. In order to erase a row, the word line for a give row is held highly negative (−12 to −14 volts). All the bit lines associated with the given row are connected to a low positive voltage, about +3 volts, such as $V_D$, the drain bias voltage. The common source bias SG to zero or well positive voltage to maintain off state. The potential of region 14, $V_{P\text{-}well}$, is maintained at a high level (e.g. 3 volts). The above discussion is likewise applicable with reference to the 2T array 200. Control gates of unselected cells are toggled low (the circuit supply voltage). A phenomenon known as erase disturb wherein unselected cells are erased could occur. However, due the relatively strong negative voltage (e.g. −12 volts) used to erase a cell, this is less likely.

Reading

With reference to FIG. 3, in order to read the contents of a selected 2T memory cell 26, selection gate 34 of transistor 22 within cell 26 is toggled high (e.g., the circuit supply voltage) along with the associated bit line (e.g. 1.5 volts) of selected cell 26. Unselected bit lines are biased low (e.g., circuit ground). Likewise voltage $V_{P\text{-}well}$, the p-well 14 voltage, is biased low (at circuit ground.). $V_S$ is also maintained low (i.e., circuit ground). Selection gate 34 of unselected bit lines are pulled low. Control gates 28 are pulled low (e.g., circuit ground) during a read operation. Bit line disturb could occur along cells associated with the same bit line. Additionally gate disturb could occur along cells associated with cells having the same selection gate line as the selected cell. The use of the circuit supply voltage in the former case involving gate disturb and the low voltages used involving the latter case make these situations unlikely. With reference to the 1T array 100, the SG bias to the circuit supply voltage turns on all select transistors. Thus $V_s$ is maintained low (i.e., circuit ground).

The chart below summarizes the foregoing cell scenarios for the 2T cell of FIG. 1: Note that selection lines are operable to carry voltages capable of turning select transistor 22 on or off, thus selecting a cell. The given voltages are an example of such bias scheme, and will not limit the application of the disclosure mechanism.

| Transistor State | Bit line $BL_0$ (volts) | $V_S$ (volts) (source) | $V_P$ (well) (volts) | Control Gate (volts) (28) | Selection Transistor Gate (volts) (34) |
|---|---|---|---|---|---|
| PROGRAM | | | | | |
| Selected Cell | Transistor 22-off | −3 | Floating | −3 | +12 to +13 | −3 |

-continued

| | Transistor State | Bit line BL$_0$ (volts) | V$_S$ (volts) (source) | V$_P$ (well) (volts) | Control Gate (volts) (28) | Selection Transistor Gate (volts) (34) |
|---|---|---|---|---|---|---|
| Non Selected Cell Columns (Possible-unlikely gate disturb) | Transistor 22-off | +3 to +4 | Floating | −3 | +12 to +13 | −3 |
| Non Selected Cell Rows (Possible-unlikely bitline disturb) | Transistor 22-off | −3 | Floating | −3 | 0 to −3 | −3 |
| ERASE | | | | | | |
| Selected Cell | Transistor 22-on | +3 | +3 | +3 | −12 to −14 | Supply voltage +3 |
| Non Selected Cell (Possible-unlikely gate disturb) | Transistor 22-on | +3 | +3 | +3 | 0 to +3 | Supply voltage +3 |
| READ | | | | | | |
| Selected Cell | Transistor 22-on | +1.5 | 0 | 0 | +Vdd | Circuit supply |
| Non Selected Cell (Possible-unlikely gate disturb) | Transistor 24-off | 0 | 0 | 0 | +Vdd | Circuit supply |
| Non Selected Cell (Possible-unlikely bitline disturb) | Transistor 22-off | +1.5 | 0 | 0 | 0 | 0 |

Benefits of the Triple Well

A primary advantage of the invention is provided by the triple well structure. Triple well structures commonly experience 70% cell coupling. With that level of coupling and programming with 12 to 13 volts on the control gate and −3 volts on the p-well ($V_p=-3$ volts), the result is approximately 11–12 volts across a 100 Å tunnel oxide 33. In conventional, non-triple well devices, a structure with 12 volts on the control gate but without the negatively biased substrate (e.g., a substrate voltage of 0 volts at region 33) would only develop 8.4 volts across tunnel oxide 33 of FIG. 1. It is well known that electron tunneling is an extremely sensitive function of the capacitor cathode electric field. Electron tunneling requires a cathode electric field, $E_k=V_{tx}/T_{tx}$, of at least $10^7$ V/cm (where $T_{tx}$ is the tunnel dielectric thickness and $V_{tx}$ is the voltage dropped across this dielectric thickness, e.g. tunnel oxide 33). Eleven volts across 100 Å tunnel oxide 33 of transistor 50 provides an $E_k=1.1*10^7$ V/cm. By contrast, 8.4 volts across the tunnel oxide for a non-triple well structure in the example above, provides an $E_k=0.84*10^7$ V/cm. Another advantage of the invention is that $E_k$ is sufficient to cause tunneling without requiring a higher Vpp charge pump.

Another benefit of the triple well structure is that it allows scaling of the memory cell. Decreases in the size of the cell can include an attendant decrease in bias voltages, independent of the supply voltage. Structures without a triple well are penalized because their scaling is limited by the supply voltage since some minimum supply voltage will be required for proper functioning of peripheral circuitry, e.g. sense amps, etc. The foregoing triple well benefits are in addition to the beneficial effects of the tunnel mechanism, which prevents destruction of the tunnel oxide as previously, mentioned. A further benefit is that uniform channel programming across the tunnel oxide of the channel region results in uniform tunneling of electron to the floating gate. This has the beneficial result of keeping the distribution of Vt narrow over the entire array for different threshold voltages. The distribution is tighter compared to conventional programming techniques. For example, the threshold voltage for any given target threshold varies as little as 100 mv in a 4M array over 100,000 programming cycles. This tight array Vt distribution is the key requirement for MLC devices that allow two or more states in a given cell.

When the above concept of programming is applied to a multi-level cell (MLC), a high-density memory array can be achieved using the same generation of technology. Conventional methods to achieve MLC rely primarily on injection programming such as hot electron injection or source-side hot-electron programming. However, this method of programming is not suitable for low power portable applications, e.g. cell phones, etc. Conventional low power methods of tunneling result in wide threshold voltage ($V_G$) distribution and threshold voltage shifts over time due to hole trapping. This can result in a large internal read voltage to compensate for the wide Vt window which in turn may cause data retention problems. Neither is suitable for MLC applications that require tight Vt distribution. The programming method according to the invention uses a uniform electric potential across the tunnel oxide.

With reference to FIG. 1, this electric potential extends between the p-well and the control gate 28. A constant field on the memory array is achieved by this method of programming. The use of a constant field across the whole channel results in key advantages, such as a tight Vt distribution and very stable Vt shift over program/erase cycling. For instance, experimental results indicate a shift of only about 100 mV in Vt after 100 k program/erase cycles. This programming method also allows a multi-level cell with more than two bits per cell.

Figure 5:
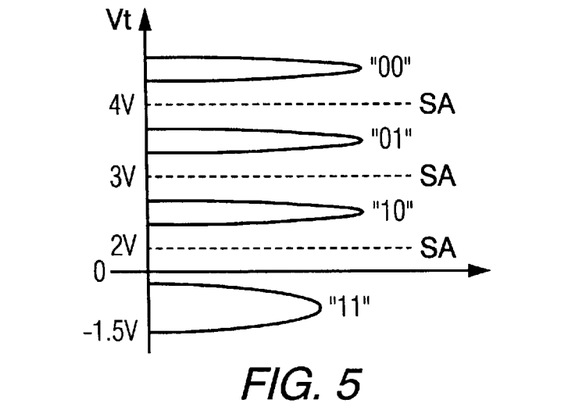
FIG. 5 is a diagram/graph of memory array threshold voltage Vt distribution (in arbitrary units, x-axis) for a two-transistor (2T) multi-level cell with N=2 (four logical states).
Figure 6:
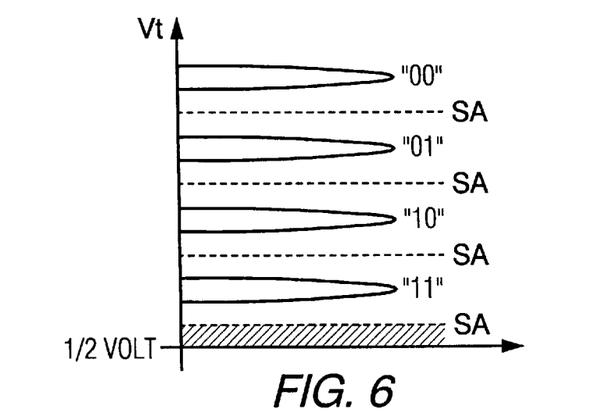
FIG. 6 is a diagram/graph of memory array threshold voltage Vt distribution (in arbitrary units, x-axis) for a one-transistor (1T) multi-level cell with N=2 (four logical states).

FIG. 5 illustrates a diagram/graph of tight threshold voltage Vt distribution in a 2T megabit array. SA indicates sense amplifier. One sense amp (SA) is indicated for each threshold voltage distribution. Binary numbers 00 through 11 indicate a multilevel cell with $2^n$ states with n bits. For the array of FIG. 4, n is equal to 2. As shown, one state (which is shown for instance as 11) is associated with a negative threshold voltage. A medium, but boosted, internal voltage for read operations is sufficient for a read operation for the 2T cell. Thus, with reference to FIG. 1, a boosted value of for instance 4.5 volts is applied to selection gate 34. Negative Vt distribution is acceptable in 2T array since the select transistor in series with each floating gate cell prevent the cell from going to depletion. That saves one logical states for SA checking. FIG. 6 illustrates tight threshold voltage Vt distribution in a megabits array for a one-transistor (1T) multi-level cell. Higher word line boosting is required for read operations with this cell as compared with the 2T case discussed above since require one extra SA. A sufficient boosted value is, for instance, 6 volts. The data retention after cycling is not as good as the 2T case due to higher internal read voltage.

Figure 7:
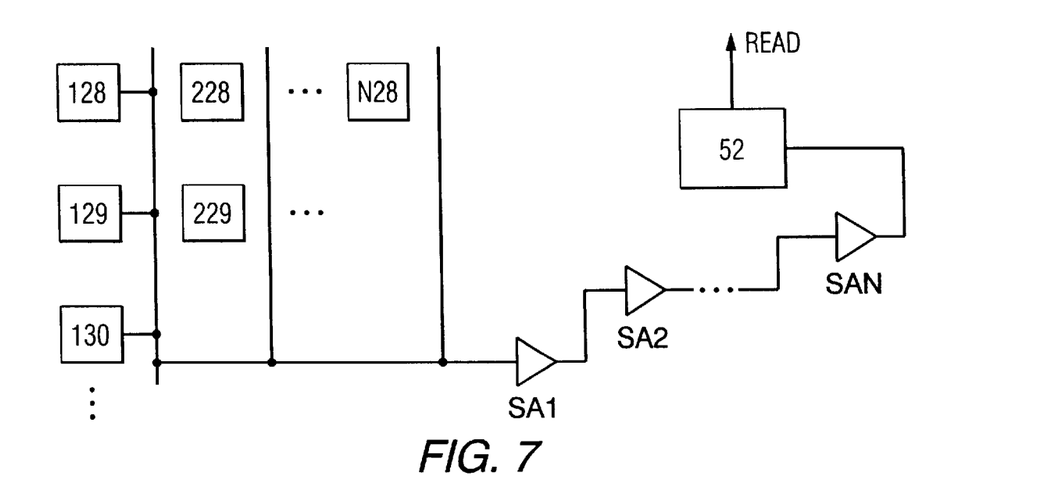
FIG. 7 is a block diagram which shows memory cell 48 connected to n (where n is a positive whole number) sense amplifiers 50 for determining the binary level (logic 0 or logic 1) of each associated state.

FIG. 7 is a block diagram which shows memory cell 128 connected to n (where n is a positive whole number) sense amplifiers SA1, SA2, . . . SAn for determining the binary level (logic 0 or logic 1) of each associated state. There are n sense amps for each state. Consequently, a multi-level cell capable of storing $2^n$ states will have n sense amplifiers. Each sense amplifier is capable of distinguishing a given binary level within a range of voltages along a given Vt distribution as shown in FIGS. 5 and 6. Sense amplifiers SAn are connected to logic circuitry 52 which outputs a multiplexed result corresponding to the level stored in memory cell 128. Memory cell 128 can comprise a 1T or 2T memory cell.

Although the invention has been described in detail herein with reference to preferred embodiments and certain described alternatives, it is to be understood that this description is by way of example only, and it is not to be construed in a limiting sense. It is to be further understood that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

We claim:

1. A flash memory comprising:

a plurality of multi-level cells, each said multi-level cell including a floating gate transistor formed in a triple well structure including a first well comprising the source and drain of the transistor, a second well of a polarity opposite to the first well and containing the first well, and a substrate of the same polarity at the first well and containing the first and second wells, a channel extending between the source and drain and covered with a tunnel insulator and a floating gate, a control gate over the floating gate and insulated from said floating gate, and means for applying substantially uniform electric potential to the channel for tunneling charge carriers between the channel and the floating gate and through the tunnel insulator.

2. The flash memory of claim 1 wherein each said multi-level cell is a one transistor memory cell.

3. The flash memory of claim 1 wherein each said multi-level cell is a two transistor memory cell.

4. The flash memory of claim 1 wherein each multi-level cell is capable of storing $2^n$ states where n is a whole number which is greater than or equal to two.

5. The flash memory of claim 1 further comprising means for applying a potential to the first well and letting the source and drain float in order to program or erase a said multi-level cell.

6. A method of programming a flash memory array comprising a plurality of floating gate transistor in a substrate having first and second wells, with the first well inside the second well and the second well is of opposite polarity compared to the substrate and the first well, said first well comprising source and drain regions with a channel disposed between said source and drain regions, a floating gate insulating layer over the channel, a floating gate electrode on the floating gate insulator, an inter-gate insulator on the floating gate, and a control gate electrode on the inter-gate insulator, comprising the steps of:

applying a substantially uniform electric field over the channel; holding the first well at a fixed potential;

allowing the source and drain regions to float to a potential determined by the potentials applied to the channel and the first well; and adjusting the intensity of the substantially uniform field an amount sufficient to tunnel electrical charges through the gate oxide for the storage between the control gate and the floating gate or away from the floating gate and into the channel.

7. The method of claim 6 further comprising the steps of:

raising the intensity of the electric filed above the channel to a level sufficient to tunnel charges past the floating gate oxide;

storing the tunneled charges between the floating gate and the control gate.

8. The method of claim 7 further wherein the transistor comprises a p-type substrate, a first n-type well, an second p-type well and n-type regions in the second p-type well to form source and drain regions.

9. The method of claim 7 further wherein the transistor comprises an n-type substrate, a first p-type well, a second n-type well and p-type regions in the second n-type well to form source and drain regions.

10. The method of claim 8 wherein the first p-type well is held at about −3-volts and the control gate is raised to about 12 to 13 volts and the source and drain are allowed to float.

11. The method of claim 9 wherein the first n-type well is held at about +3 volts and the control gate is lowered to about −12 to −13 volts and the source and drain are allowed to float.

12. The method of claim 8 wherein the applied electric field is raised to one or more levels in accordance with a desired storage state.

* * * * *